United States Patent [19]

Tiemann et al.

[11] 4,259,598

[45] Mar. 31, 1981

[54] CHARGE TRANSFER SIGNAL PROCESSING APPARATUS TRANSVERSAL FILTER

[75] Inventors: Jerome J. Tiemann, Schenectady; William E. Engeler, Scotia, both of N.Y.

[73] Assignee: General Electric Company, Schenectady, N.Y.

[21] Appl. No.: 105,756

[22] Filed: Dec. 20, 1979

[51] Int. Cl.³ .................... G11C 19/28; H01L 29/78; H03H 15/02
[52] U.S. Cl. ............................. 307/221 D; 357/24; 333/165
[58] Field of Search .................. 307/221 D; 357/24; 333/165

[56] References Cited

U.S. PATENT DOCUMENTS

| | | | |
|---|---|---|---|
| 4,163,957 | 8/1979 | Knauer et al. | 307/221 D |
| 4,188,597 | 2/1980 | Knauer | 307/221 D |

OTHER PUBLICATIONS

Knauer et al., "Parallel-in/Serial-out: A New Approach for CCD Transversal Filters", Electronics Letters, vol. 13, (Mar. 3, 1977), pp. 126-127.

*Primary Examiner*—Gene M. Munson
*Attorney, Agent, or Firm*—Julius J. Zaskalicky; James C. Davis, Jr.; Marvin Snyder

[57] ABSTRACT

A sampled data transversal filter utilizing charge transfer devices is described. The filter includes a charge transfer shift register including a plurality of stages to which a sequence of packets of charge representing samples of a signal is serially applied and clocked from stage to stage. Charge division and collection means are provided at the various stages of the shift register to divide and collect the fractions of charge appearing in the various stages thereof. These fractions represent the weighting coefficients of the various stages of the shift register. The charge collection means of the various stages are connected together to provide an output representing the sum of the charges collected at the various stages. The output sequence of packets of charge obtained represent the convolution of the input sequence of packets with the weighting coefficients of the various stages of the shift register.

10 Claims, 7 Drawing Figures

CHARGE TRANSFER SIGNAL PROCESSING APPARATUS TRANSVERSAL FILTER

CHARGE TRANSFER SIGNAL PROCESSING APPARATUS

The present invention relates in general to charge transfer signal processing apparatus and in particular relates to such apparatus for providing transversal filtering.

An object of the present invention is to provide a transversal filter in which the output thereof is a sequence of charge packets.

Another object of the present invention is to provide a transversal filter in which both the input and output thereof are pairs of sequences of charge packets whereby the cascading of such filters is simplified.

Another object of the present invention is to provide a structure for a transversal filter which has essentially complete isolation between the output thereof and the clock voltages needed to store and transfer charge packets therein.

Another object of the present invention is to provide a transversal filter of improved linearity.

A further object of the present invention is to provide a transversal filter which is capable of operation at extremely high frequencies.

In carrying out the present invention in one illustrative embodiment thereof there is provided a substrate of semiconductor material having a major surface. A plurality of charge storage cells is provided in the substrate adjacent the major surface thereof together with accompanying clock electrodes so as to implement a multi-stage shift register for charge packets. Each stage of the shift register comprises a first charge storage cell and a second charge storage cell. Each of the first charge storage cells may be divided into a first and a second charge storage region, or it may be undivided and consist entirely of either a first or a second charge storage region. A first charge storage region is functionally defined by an adjacent relationship to a charge collecting means while a second charge storage region is functionally defined by a non-adjacent relationship to such charge collecting means. The width of the first charge storage cell in a given stage corresponds to the width of the second charge storage cell of the given stage, while the width of the second charge storage cell in a succeeding stage corresponds to the width of the second charge storage region in the first charge storage cell of the given stage. Thus, the width of successive stages either decreases or remains constant depending on whether a stage has a first charge storage region or not. The ratio of the width of the first charge storage region to the total width of the first charge storage cell of each stage is set equal to a respective one of a first sequential series of predetermined impulse response values. The value assigned to each of the first charge storage cells, except for the last first charge storage cell, not divided into a first and second region is zero. The value assigned to the last cell is unity. A plurality of charge collection means is provided, each charge collection means being coupled to a respective first storage region for collection of charge stored therein. The plurality of collection means is connected in common. A sequence of packets of charge, each packet representing a respective component of a sample of a signal is provided. Means are provided for introducing serially into the initial cell of the shift register each of the first packets of charge of the sequence and thereafter periodically and serially transferring each of the packets of charge from one first charge storage cell to the next first charge storage cell including the transfer of portions of the packets of charge from each of the first storage regions to a respective collection means. The charges collected on the collection means connected in common constituting an output sequence of packets of charge.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
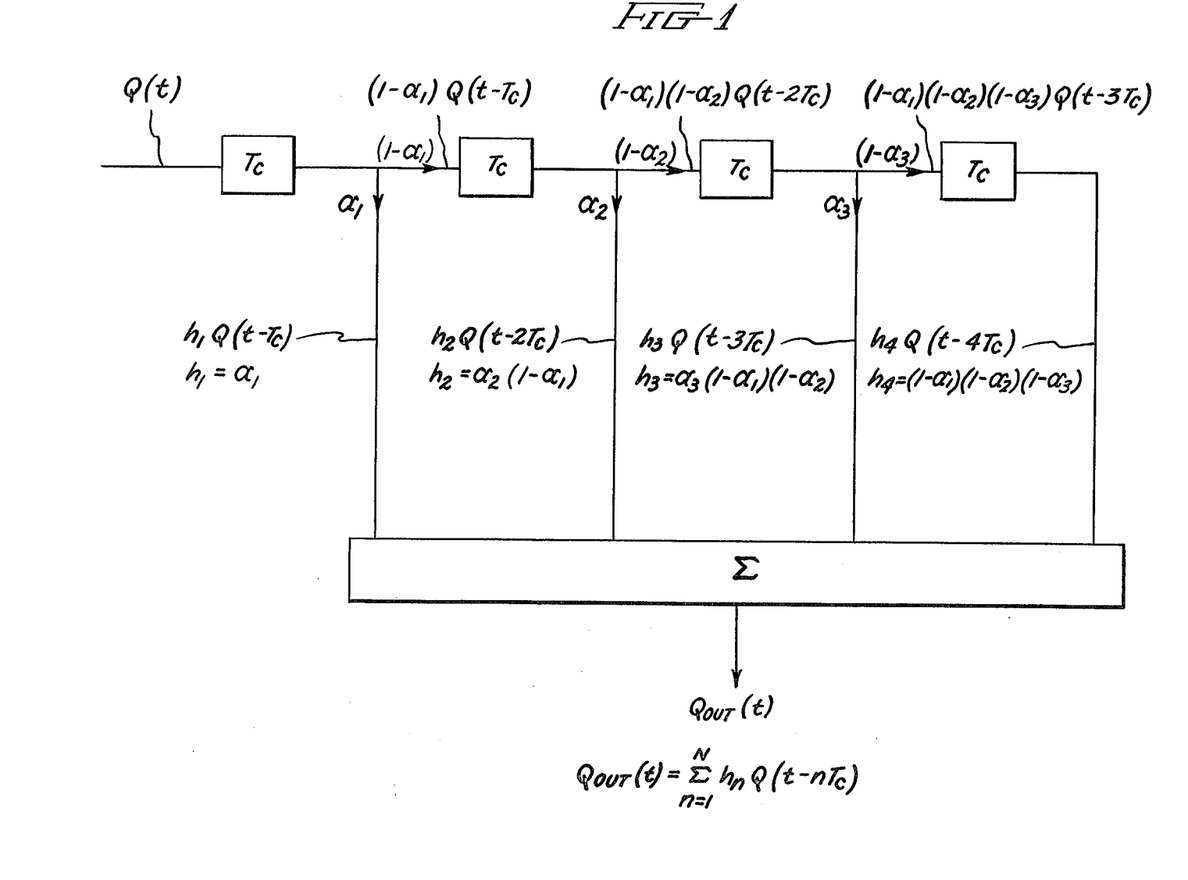
FIG. 1 is a functional block diagram of one embodiment of a transversal filter in accordance with the present invention.

Reference is now made to FIG. 1 which shows a functional block diagram of one embodiment of a charge transfer transversal filter in accordance with the present invention. The diagram is for a sampled data transversal filter with positive tap weights or weighting factors and for signals having only positive samples. The transversal filter comprises a charge transfer shift register having N stages, conveniently shown as four stages. A sequence $Q(t)$ of packets of charge each representing a respective sample of a signal is introduced therein and serially transferred or clocked from stage to stage at a frequency $f_c$ with each stage providing a delay of $T_c$, where $T_c$ is equal to $1/f_c$. The packet of charge in each of the stages is split into a first portion $\alpha$, which is collected in a common charge collecting or summation means and a second portion $(1-\alpha)$ which is transferred to the next stage of the shift register. Thus, for each packet of charge introduced into the shift register successive fractions of the packet of charge are collected over successive clock cycles by the common collecting means. For each of the first to the fourth stages these successive fractions are designated respectively $h_1$, $h_2$, $h_3$ and $h_4$, and are denoted tap weights or weighting factors. The respective fractions $h_1$, $h_2$, $h_3$ and $h_4$ of the four stages in terms of the charge splitting ratios $\alpha_1$, $\alpha_2$, $\alpha_3$ and $\alpha_4$ of the four stages of the shift register are set forth in the following equations:

$$h_1 = \alpha_1 \tag{1}$$

$$h_2 = \alpha_2(1-\alpha_1) \tag{2}$$

$$h_3 = \alpha_3(1-\alpha_1)(1-\alpha_2) \tag{3}$$

$$h_4 = (1-\alpha_1)(1-\alpha_2)(1-\alpha_3) \tag{4}$$

The quantity of charge $Q_{out}(t)$ collected by the collecting means for the sequence of packets of charge introduced into the shift register may be represented by the following equation:

$$Q_{out}(t) = \sum_{n=1}^{N} h_n Q(t - nT_c) \quad (5)$$

Thus, the output signal $Q_{out}(t)$ is the convolution of N samples of the input signal $Q(t)$ with a set of N weighting factors, where N is 4, $T_c$ is the delay provided by each stage, and t represents time.

Figure 2:
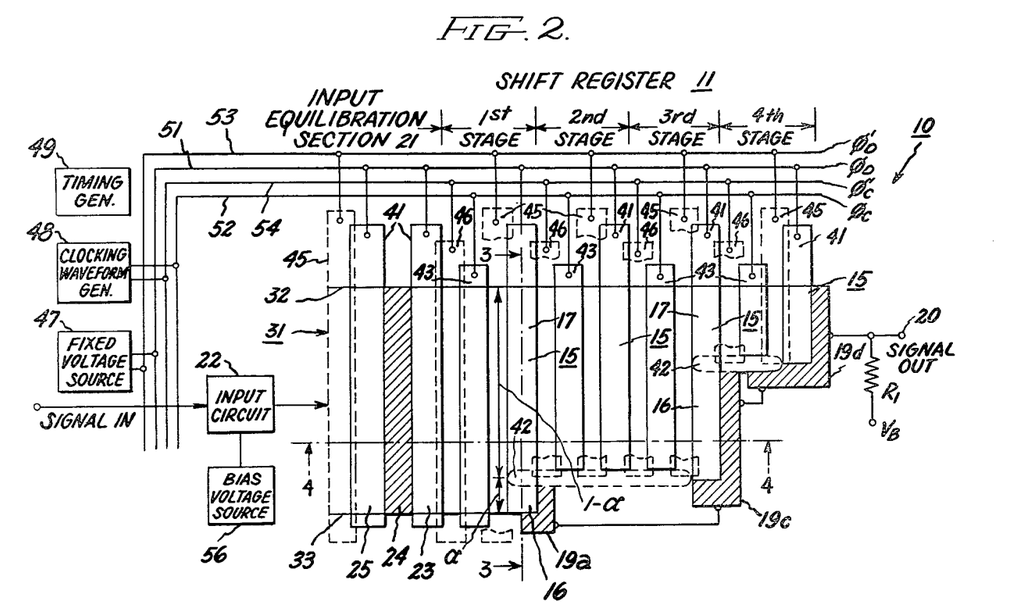
FIG. 2 is a plan view of an implementation of the transversal filter shown in FIG. 1.
Figure 3:
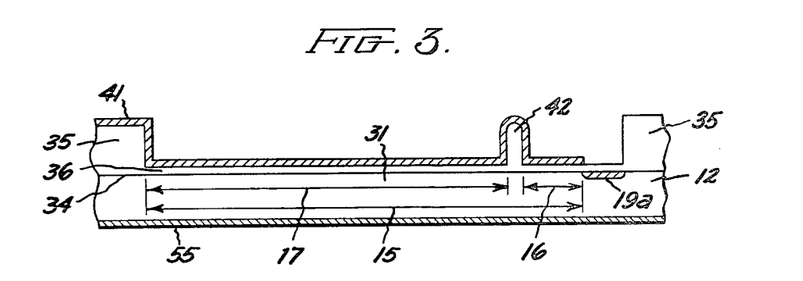
FIG. 3 is a sectional view of the embodiment of FIG. 2 taken along section lines 3—3 thereof.
Figure 4:
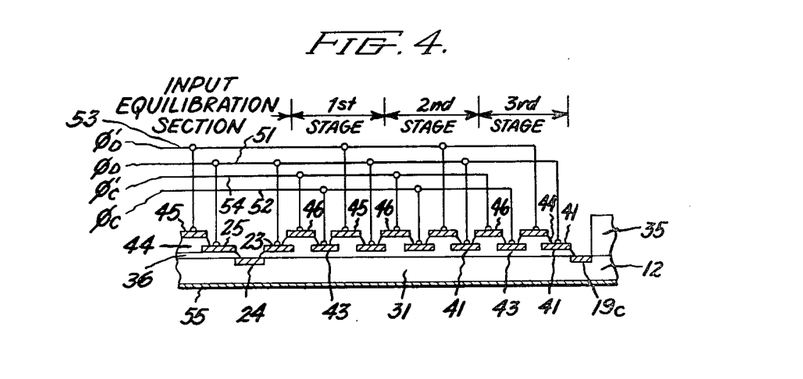
FIG. 4 is a sectional view of the embodiment of FIG. 2 taken along section lines 4—4 thereof.

Reference is now made to FIGS. 2-4 which show apparatus 10 for the implementation of the charge transfer transversal filter of FIG. 1 in accordance with the present invention. The apparatus 10 comprises a charge transfer shift register 11 including a plurality of charge storage and transfer stages formed on a common semiconductor substrate 12. The shift register 11 is shown as having four stages for reasons of simplicity in illustrating and describing the filter. Each of the stages includes a first charge storage cell 15. The first charge storage cells 15 of the successive stages form a sequence of first charge storage cells. The first charge storage cell 15 of the first stage has a width of unity. Each succeeding first charge storage cell 15 has a width equal to or less than the respective preceding first charge storage cell 15. Each first charge storage cell 15, which has a width greater than the width of a succeeding first charge storage cell, has two parts: a first part 16 designated as a first charge storage region having an effective width equal to $\alpha$ times its total width and a second part designated as a charge storage region 17 having an effective width equal to $(1-\alpha)$ times its total width.

The first charge storage cell of the first stage has a first storage region of width ratio $\alpha_1$ and a second storage region of width ratio $(1-\alpha_1)$. The first charge storage cell of the second stage is undivided and contributes nothing to the collection means; accordingly the width ratio $\alpha_2$ is equal to zero. The first charge storage cell of the third stage has a first storage region of width ratio $\alpha_3$ and a second storage region of width ratio $(1-\alpha_3)$. The first charge storage cell of the fourth stage is undivided and contributes its entire contents to the collection means; accordingly the width ratio $\alpha_4$ is equal to one. Adjacent the first storage region 16 of the first stage a first charge recovery or collection means in the form of a region 19a of opposite conductivity type formed in the substrate is provided for collection of charge flowing into the first storage region 16 of this stage. As the first charge storage cell of the second stage does not have a first charge storage region a corresponding collection means is not needed. Adjacent the first storage region 16 of the third stage a charge collection means in the form of a region 19c of opposite conductivity type is also provided. Adjacent the first charge storage cell 15 of the fourth or last stage a charge collection means in the form of a region 19d of opposite conductivity type is further provided. The charge collection means 19a, 19c and 19d are connected together to provide the aggregate or sum of the charge collected at each of the stages of the shift register. The potential on the collection means 19a, 19b and 19d are maintained at a value less than the potentials at the storage region 16 of respective first, third and fourth stages of the shift register to enable collection of charge by connection of the collection means 19a, 19c and 19d to a bias voltage $V_B$ through a load resistance $R_1$. The flow of collected charge develops an output signal across the load resistance $R_1$.

An input equilibration section 21 is provided for receiving and storing packets of charges supplied thereto by an input circuit 22. The input equilibration section 21 comprises a first charge storage cell 23 of the same width as the first charge storage cell 15 of the first stage and coupled thereto along its width, a region of opposite conductivity type 24 of the same width as the first charge storage cell 15 of the first stage and contiguous to first charge storage cell 23 along its width, and another first charge storage cell 25 also of the same width as the one first charge storage cell 15 and contiguous to the region 23 of opposite conductivity type along its width.

While lengths of first storage cell 23, region 24, and first storage cell 25 in the direction of charge transfer are shown as of the same length as the length of the first storage cells 15 for reasons of simplicity in illustrating and describing the apparatus, they are not required to be of such length. Both first cells 23 and 25 can be shorter in length than the length of a first charge storage cell 15. In general first storage cell 25 would be shorter. The length of region 24 should be minimal consistent with good conductivity.

The shift register 11 is formed on a semiconductor substrate 12 of N-type conductivity which has a channel portion 31, the upper side 32 of which is straight and the lower side 33 of which has several steps. Typically the substrate 12 may be silicon semiconductor of suitable resistivity, for example, 4 ohm-cm. Overlying the major surface 34 of the substrate 12 is a thick insulating member 35 of silicon dioxide having a thin portion 35, for example 1000 Angstroms thick, lying in registry with the channel portion 31.

A plurality of first parallel clock lines 41 is provided each extending parallel and overlying a respective one of the first charge storage cells 15. The portions of lines 41 overlying the first storage cell 15 of the first stage and also cells 23 and 25 are of the same width and is considered of unity width as it contains the entire input packet of charge. The width of the line 41 overlying first charge storage cell 15 of the second stage is equal to $(1-\alpha_1)$ times the unity width of the first charge storage cell of the first stage. The width of the line 41 also overlying first charge storage cell 15 of the third stage is also equal to $(1-\alpha_1)$ times unity width as charge is not split in the second stage. The width of the line 41 overlying the first cell of the fourth stage is equal to $(1-\alpha_1)(1-\alpha_3)$ times unity width. The division of the first cell of the first stage and the first cell of the third stage into a first storage region 16 and a second storage region 17 is implemented by respective blocks 42 of thick insulation over which the lines 41 pass. A plurality of second parallel lines 43 is provided, each parallel to the lines 41 and interleaved therebetween. The portions of the substrate in the channel portion 31 underlying these conductors are designated the second charge storage cells. Each of the lines 41 is of uniform length dimension in the direction of the charge transfer in the channel. Similarly, each of the second lines 43 is of uniform length dimension in the direction of the charge transfer in the channel. The lines 41 and the lines 43 are spaced apart by a distance equal to less than the length of a line 41. Another thin layer of insulation 44 (FIG. 4), for example 1000 Angstroms thick, is provided overlying the first and second parallel lines. A plurality of third parallel lines 45 is provided overlying the insulating layer 44. Each of the third lines 45 is insulatingly spaced between a respective first line 41 and a respective preceding second line 43. The third lines 45 overlie both the first lines 41 and second lines 43. A plurality of fourth parallel lines 46 is also provided overlying the insulating layer 44. Each of the fourth lines 46 is insulatingly spaced between a respective second line 43 and a respective preceding first line 41. The fourth lines 46 overlie both the second and first lines. The third and fourth lines 45 and 46 are shown in dotted outline to illustrate with clarity the structure and organization of the apparatus. The sets of four lines 41, 43, 45 and 46 form a pluarlity of groups of electrodes, each group of electrodes being serially arranged on a respective part of the thin portion 36 of the insulating member and overlying a respective part of the channel 31 of the shift register to form with the substrate a plurality of stages of a charge transfer shift register.

The first lines 41 overlying the first and second storage regions 16 and 17 of the first storage cells 15 are designated as $\phi_D$ electrodes and are connected to a common line 51 which is connected to a source 47 of $\phi_D$ voltage. All of the second lines 43 overlying the second storage cells are designated as $\phi_C$ electrodes and are connected to a common line 52 which is connected to a source 48 of $\phi_C$ clocking voltage. All of the transfer electrodes 45 which overlie the leading or input edge of the first storage cells 41 are designated $\phi_D'$ electrodes and are connected to a common line 53 which is connected to source 47 of $\phi_D'$ voltage. All of the transfer electrodes 46 which overlie a leading or input edge of a $\phi_C$ electrode 43 are designated as $\phi_C'$ electrodes and are connected to a common line 54 which is connected to source 48 of $\phi_C'$ voltage. A conductive layer 55 of a suitable material such as gold is eutectically bonded to the lower surface of the substrate 12 to provide a substrate contact to which the ground line of the $\phi_D$, $\phi_D'$, $\phi_C$ and $\phi_C'$ voltages sources are connected.

Figure 5:
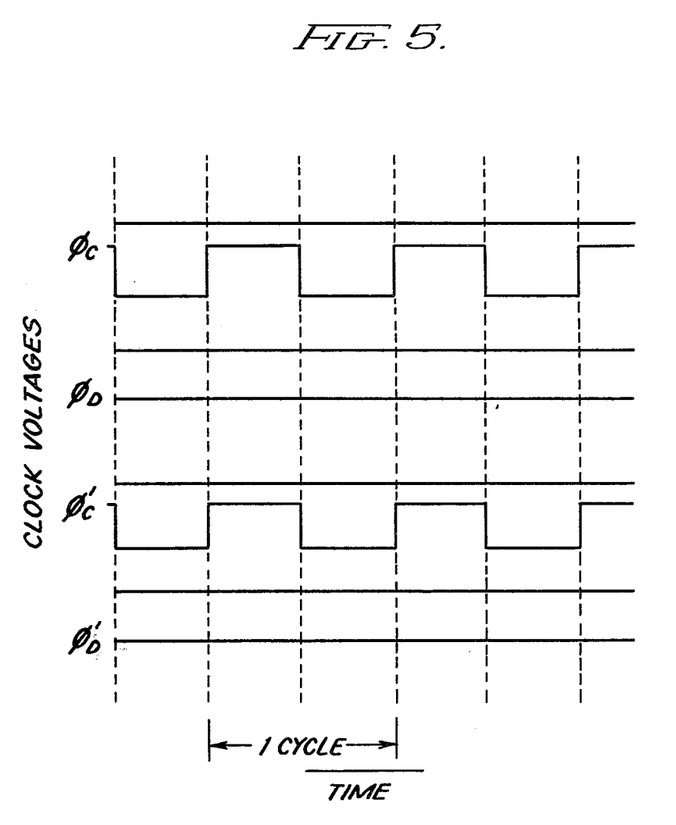
FIG. 5 is a diagram of voltage waveforms utilized in the operation of the transversal filter of FIG. 2.

The manner in which packets of charge are clocked into the shift register 11, transferred from stage to stage along the shift register and processed therein will now be described in connection with the waveform diagrams of FIG. 5, which shows the clocking waveform voltages $\phi_D$, $\phi_C$, $\phi_D'$ and $\phi_C'$, which are applied respectively to lines 51-54.

Each stage of the shift register 11 includes a $\phi_D$ storage cell (first storage cell) underlying a $\phi_D$ line 41 and a $\phi_C$ storage cell (second storage cell) underlying a $\phi_C$ line 43. The $\phi_D$ voltage applied to the $\phi_D$ line 41 is fixed. The $\phi_C$ voltage applied to the $\phi_C$ line cycles between a high level and a low level above and below the $\phi_D$ voltage. When the $\phi_C$ voltage is at its high level charge transfer is enabled from the $\phi_C$ cell to the $\phi_D$ cell, and conversely when the $\phi_C$ voltage is at its low level charge transfer from the $\phi_D$ cell to the $\phi_C$ storage cell is enabled. Each stage also includes a $\phi_D'$ line 45 to which is applied a $\phi_D'$ voltage of fixed value which produces a surface potential in the substrate underlying the electrode which is smaller in absolute magnitude than the surface potential underlying a $\phi_D$ line. Each stage also includes a $\phi_C'$ voltage having two levels. At the upper level a surface potential is produced in the substrate underlying the electrode which inhibits the transfer of charge from a $\phi_D$ storage cell to a $\phi_C$ storage cell. At the lower level a surface potential is produced enabling the transfer of charge from a $\phi_D$ storage cell to a $\phi_C$ storage cell. Thus, when the $\phi_C$ voltage is at its high level, charge is transferred from a $\phi_C$ storage cell to a $\phi_D$ storage cell, and when both the $\phi_C$ voltage and the $\phi_C'$ voltage are at their low levels, charge is transferred from a $\phi_D$ storage cell to a $\phi_C$ storage cell. For each cycle of the clocking voltages $\phi_C$ and $\phi_C'$, charge is transferred from a $\phi_C$ storage cell to a $\phi_D$ storage cell and then to the next succeeding $\phi_C$ storage cell.

Input circuit 22 is provided for generating packets of charge representing samples of a time-varying analog signal. Such input circuits are well-known in the art, one of which is described in connection with FIGS. 8A, 8B and 8C in the U.S. Pat. No. 4,032,867, assigned to the assignee of the present invention and incorporated herein by reference thereto. This particular circuit is referred to as a "fill and spill" circuit. Of course, other input circuits may be utilized. A bias voltage source 56 connected to the input circuit provides a fixed bias charge component to each input packet of charge to facilitate the transfer thereof and also when desired to accommodate both negative as well as positive signal samples. When the bias source is used, if a signal sample is positive a corresponding signal related charge is added to the fixed bias charge to constitute the input packet, and conversely if the signal sample is negative a corresponding signal related charge is subtracted from the fixed bias charge to constitute the input packet. Thus, the packet of charge applied to the input of the shift register is the algebraic sum of the fixed bias charge and the signal related charge.

The input section 21 is constituted of a pair of first charge storage cells 23 and 25 spaced apart by region 24 of a conductivity type opposite to the conductivity type of the substrate. With a $\phi_D$ voltage applied to the lines 41 overlying cells 23 and 25 an enlarged first charge storage cell is provided. The potential of the region 24 of opposite conductivity type is determined by the potential produced by the $\phi_D$ voltage in the cells 25 and 23. The lines 45 and 41 of the input section 22 would be constituted as the $\phi_D'$ and $\phi_D$ electrodes of the last stage of the input circuit 22.

The output circuit is provided for sensing the charge collected on the collecting means in the form of a load resistor $R_1$ connected between the common collecting means 19a, 19c, and 19d and a source (not shown) of voltage $V_B$. To facilitate collection of charge by the collection means 19a, 19c and 19d, the voltage $V_B$ is selected to provide a potential in the first charge storage cells contiguous thereto slightly less than the surface potentials of these storage cells when devoid of charge.

In the operation of the apparatus of FIG. 2 a packet of charge corresponding to a sample of a signal is supplied from the input circuit 22 into the input section 21 of the shift register 11. Over a first clocking cycle the packet is transferred into the first storage cell 15 of the first stage where it is divided into a fraction $\alpha_1$ in region 16 and collected by the collecting means 19a. The portion of the charge packet stored in the second storage region 17 of the cell is a fraction $(1-\alpha_1)$ of the original packet. Over the next clocking cycle this fraction of the packet of charge is transferred into the first storage cell of the second stage where it remains intact as $\alpha_2$ is equal to zero. Over the third clocking cycle the packet of charge in the first storage cell of the second stage is transferred to the first storage cell of the third stage where it is divided into a portion stored in the first storage region 16 of this cell equal to $\alpha_3$ times $(1-\alpha_1)$ and another portion stored in the second portion of this cell equal to $(1-\alpha_3)$ times $(1-\alpha_1)$. The former portion of charge is collected on the collection means 19c. Over the fourth clock cycle the latter portion of the charge is transferred from the third stage of the shift register to the first storage cell of the fourth stage and is collected by the collection means 19d. As the collection means 19a, 19c and 19d are connected together and through load resistance $R_1$ to bias voltage $V_B$, packets or fractions of packets of charge as they are recovered on these collection means cause a current to flow through the resistor $R_1$ and produce a voltage at the terminal 20 corresponding to the sum of the individual charge packets. When a sequence of charge packets, each corresponding to a respective sample of a signal, are applied to the input section of the shift register, the packets are clocked simultaneously from stage to stage in sequence and fractions thereof are collected on the various collecting means of the apparatus during each clocking cycle. In this case the charge collected on the combined collection means 19a, 19c and 19d is the sum of the contributions of the various packets of the sequence and accordingly the voltage developed across the resistance $R_1$ at output terminal 20 would correspond thereto as set forth in equation 5 above.

In view of the fact that the bias charge level provided to the input circuit 22 corresponds to zero signal level, the apparatus of FIG. 2 would provide filtering for signals of negative as well as positive polarity provided the negative amplitude of signal sample does not exceed the bias level, that is the deficit of charge must not exhaust the bias charge portion of a packet.

The charge division ratios ($\alpha$'s) for each stage and hence the weighting coefficients (h's) for each of the stages are selected to provide the desired impulse response in accordance with equation 5. Of course, while only four stages were shown in the filter of FIG. 2, any number may be utilized. Also in any multistage filter, if desired, the collection means of the last or $N^{th}$ stage may be disconnected from the charge collection means of the other stages and the charge collected thereby discarded. In such an apparatus the weighting coefficient of each of the cells of the remaining (N−1) stages thereof are all independent.

In general the charge collection for output purposes may be divided into a number of output charge sums each derived from groups of charge collection means located at their respective stages. Also, while we have shown in FIG. 2 a charge division into two parts, in general, the charge may be divided into three or more parts with each of the output charge parts summed into its respective output. The detailed implementation is dependent on the filter function desired.

Figure 6:
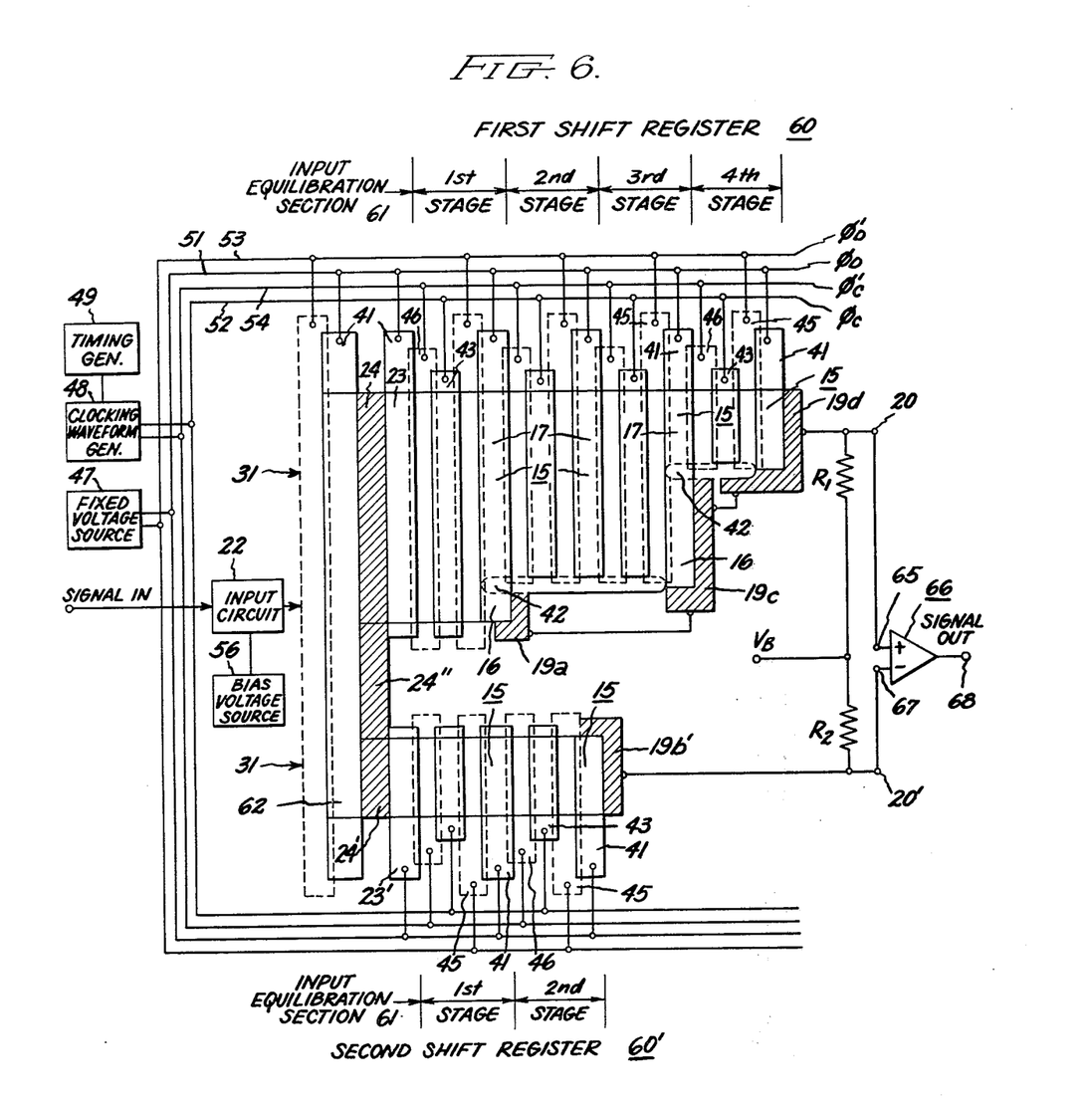
FIG. 6 is a plan view of another embodiment of the present invention.

FIG. 6 shows a sample data transversal filter having four stages in which both positive and negative weighting coefficients are utilized in the various stages thereof. The weighting coefficients are selected to provide a desired output response for samples of signal applied to the input thereof. Arbitrarily the weighting coefficients of the first to fourth stages of the filter are set to be $h_1$, $h_2'$, $h_3$ and $h_4$, respectively, where the weighting coefficients $h_1$, $h_3$ and $h_4$ are positive and the weighting coefficient $h_2'$ is negative. The positive weighting coefficients of the filter are provided in a first shift register 60 and the negative coefficients are provided in a second shift register 60'. The positive weighting coefficients $h_1$, $h_3$ and $h_4$ are provided in the first, third and fourth stages of the first shift register 60. The negative weighting coefficient $h_2'$ is provided in the second stage of the second shift register 60'. Since the negative weighting coefficient with largest delay is provided in the second stage of the example shown, only two stages are necessary in the second shift register 60'. The first shift register 60 is identical to the first shift register 11 of FIG. 2, and identical designations are utilized for the various elements thereof. For convenience in describing the invention the positive weighting coefficients are identical to the positive weighting coefficients $h_1$, $h_3$ and $h_4$ of shift register 11 of FIG. 2. The second shift register 60' is identical in constitution to the first shift register 11 and corresponding elements are identically designated. However, the second shift register 60' is different in form from shift register 60 due to the fact that the negative weighting coefficients are different and are located in different stages of the transversal filter. As each stage can have only one weighting coefficient other than zero, either positive or negative, when a positive weighting coefficient is provided in one stage of shift register 60, the corresponding weighting coefficient in the shift register 60' would be zero and also when the weighting coefficient in the second shift register 60' has a definite value, the weighting coefficient in the first shift register 60 would be zero.

The second shift register 60' is formed on the substrate 12 adjacent the first shift register 60 and has a channel portion 31' having a width corresponding to the absolute magnitude of the weighting coefficient $h_2'$. The proportion of the charge supplied from the input circuit 22 to the first and second shift registers is divided in proportion to the ratio of the absolute magnitude of weighting coefficient $h_2$40 to the sum of the absolute magnitudes of weighting coefficients $h_1$, $h_3$, $h_2'$ and $h_4$, that is the sum of the absolute magnitudes of the weighting coefficients $h_1$, $h_2$, $h_3$ and $h_4$ equals 1. The second shift register 60' includes a second charge storage region 15 in a first storage cell 15 of a first stage thereof and a first charge storage region in a first storage cell of the second stage thereof. Adjacent the first charge storage region of the second stage a collection means in the form of a region of opposite conductivity type 19b' for collection of the charge flowing into the first charge storage cell 15 of this stage is provided. The input section 22 of the filter supplies charge to both the first shift register 60 and the second shift register 60' in relative amounts depending on the relative sums of the weighting coefficients thereof. To this end a first charge storage cell 23' of the same width as the first charge storage cell 15 of the first stage of the second shift register 60' and coupled thereto along its width is provided. A region of opposite conductivity type 24' of the same width as the first charge storage cell 15 of the first stage of the second shift register and contiguous to the first charge storage cell 23' along its width is also provided. The region of opposite conductivity type 24 of the first shift register 60 is connected to the region 24' of opposite conductivity type of the second shift register 60' by a connecting region 24" of opposite conductivity type. A common input section 61 is provided for receiving signal charge and supplying it to first stage of the first shift register 60 and to the first stage of the second shift register 60'. The input section 61 is provided with a first charge storage cell 62 of a width equal to the widths of regions 24, 24", and 24' of opposite conductivity type and contiguous therewith along its width. A first line 41 is provided overlying the first charge storage cell 62 and also a transfer line 45 is provided overlying the first charge storage cell along its width.

As in connection with the first shift register 11 of FIG. 2 and first shift register 60 of FIG. 6, a plurality of first parallel lines 41 are provided each extending generally parallel and overlying a respective one of the first charge storage cells 15 of the second shift register 60'. The portions of the line 41 overlying the first storage cell 15 of the first and second stages and also cell 23' are of the same width. A plurality of second parallel lines 43 are also provided, each parallel to the line 41 and interleaved therebetween. The portions of the substrate in the channel portion 31' underlying these conductors are designated the second charge storage cells. Each of the lines 41 is of uniform length in the direction of the length dimension of the channel 31'. Similarly, each of the second lines is of uniform length in the direction of the length dimension of the channel 31'. The lines 41 and the lines 43 are spaced apart by a distance equal substantially to the length of a line 41. A thin layer of insulation 44 is provided overlying the first and second parallel lines 41 and 43. A plurality of third parallel lines 45 are provided overlying the insulating layer 44. Each of the third parallel lines 45 is insulatingly spaced between a respective first line and a respective preceding second line 43. The third parallel lines 45 overlie both the first lines 41 and the second lines 43. A plurality of fourth parallel lines 46 are also provided overlying the insulating layer 44. Each of the fourth lines 46 is insulatingly spaced between a respective second line 43 and a respective preceding first line 41. The fourth lines 46 overlie both the second and first lines.

As described above in connection with FIG. 2 all of the first lines 41 overlying the first charge storage cells 15 are designated as $\phi_D$ electrodes and are connected to a common line 51 which is connected to the source 47 of $\phi_D$ voltage. All of the second lines 43 overlying the second storage regions are designated as $\phi_C$ electrodes and are connected to a common line 52 which is connected to the source 48 of $\phi_C$ clocking voltage. All of the transfer electrodes 45 which overlie the leading or input edge of the first storage cells 41 are designated as $\phi_D'$ electrodes and are connected to a common line which is connected to the source 47 of $\phi_D'$ voltage. All of the transfer electrodes 46 which overlie a leading or input edge of a $\phi_C$ electrode 43 are designated as $\phi_C'$ electrodes and are connected in common to a common line 54 which is connected to the source 48 of $\phi_C'$ voltage.

The input circuit of the apparatus of FIG. 6 including the biasing voltage source 56 therefor provides packets of charge representing samples of a signal and is identical to the input circuit 22 of FIG. 2 and is so designated. The bias voltage source 56 connected to the input circuit 22 provides a fixed bias charge component to each packet of input charge not only to facilitate the transfer of charge from stage to stage but also to accommodate both negative as well as positive signal samples, as explained above. The packet of charge applied to the input section 61 of the shift registers is the algebraic sum of a fixed bias charge and the signal related charge. The input section 61 is constituted of the first charge storage cell 23 of the first shift register 60, the first charge storage cell 23' of the second shift register 60', the region 24 of opposite conductivity type contiguous along its length with the first charge storage region 23, the region 24' of opposite conductivity type contiguous with the first charge storage cell 23', a region 24" of opposite conductivity type connecting the regions 24 and 24' and a first charge storage cell 62 of width equal to the sum of widths of the regions 24, 24', and 24" opposite conductivity type and contiguous with these regions of opposite conductivity type along their widths. The storage cells 23, 23' and 62, and the regions 24, 24' and 24" constitute a composite storage cell into which charge from the input circuit 22 is transferred. The proportion of the charge from this storage region which is transferred into the first shift register is determined by the ratio of the width of the first charge storage cell 23 to the sum of the widths of the first charge storage cells 23 and 23'. Conversely, the proportion of the total charge transferred to the composite storage cell which is transferred into the second shift register is determined by the ratio of the width of the storage cell 23' to the sum of the widths of the storage cells 23' and 23.

An output circuit is provided for sensing the charge collected in the common collecting means of the first shift register and for sensing the charge collected in the common collecting means of the second shift register and providing an output which represents the difference of the sensed charge. To this end a bias voltage $V_B$ is applied to the common collecting means of the first shift register through a first resistance $R_1$ and also to the common collecting means 19b' of the second shift register through a second resistance $R_2$ which is equal to the first resistance $R_1$. The potential of $V_B$ is set to provide a potential at the collecting means of each of the shift registers which is less than the surface potential of the empty storage regions or storage cells 15 of the first and second shift registers. The voltage produced at the common collecting terminal 20 of the first shift register is applied to the non-inverting terminal 65 of a differential amplifier 66. The voltage developed at the common collecting terminal 20' of the second shift register is applied to the inverting terminal 67 of the differential amplifier 66. Thus, at the output terminal 68 of the differential amplifier a signal is obtained which is the difference of the signals appearing at terminals 20 and 20'.

An alternative output circuit for obtaining the difference of the outputs appearing on the common collection terminal 20 and the common collection terminal 20' may be a precharge and float circuit such as is described in connection with FIG. 9 of U.S. Pat. No. 4,084,256, assigned to the assignee of the present invention and which is incorporated herein by reference thereto. In FIG. 9 of the patent the differential output circuit 100 includes a precharge and float circuit 102 which would be used in connection with the output of the first shift register, a precharge and float circuit 10 which would be utilized in connection with the output from the second shift register, and a differential amplifier 104 to which the outputs of the two shift registers would be applied and a differential output obtained therefrom. The precharge and float circuit 102 comprises a transistor having a source to drain conduction path connected between the common collection means of the first channel and a source of precharge potential $V_B$ set to lie below the surface potential of the first charge storage cells 15. The gate of the transistor would be connected to the $\phi_C$ voltage line of the source 48. Thus, when the $\phi_C$ storage sites or second storage cells of the first shift register is receiving charge the transistor is turned on and a precharge voltage is applied to the regions 19a, 19b and 19c of opposite conductivity type. During the next period of the clock cycle, when the $\phi_C$ lines 43 are high in potential, the second storage cells underlying the $\phi_C$ electrodes rise in potential and enable charge to flow into regions 19a, 19b and 19c and alter the potential thereof in accordance with the magnitude of the charge transferred. The change in voltage on the collecting means 19a, 19b and 19c is applied through a source follower to the non-inverting terminal of the differential amplifier 104. The precharge and float circuit 103 is identical to the precharge and float circuit 102 and is similarly connected to the collection means 19b' of the second shift register. Accordingly charge collected by the collection means 19b' is similarly sensed and applied through the source follower of the circuit 103 to the inverting terminal of the differential amplifier 104. Thus, at the output of the differential amplifier 104 the difference of the charges collected at the charge collecting means of the first and the second shift registers is sensed and an output provided.

In the operation of the apparatus of FIG. 6 a packet of charge corresponding to a sample of a signal is supplied from the input circuit 22 into the input section 61 of the filter where it is stored in the composite storage cell comprising storage cells 23, 23' and 62. Over a first clocking cycle the packet of charge is split into a first portion which is equal to a first fraction of the total charge stored in the composite first storage region and a second fraction. The first fraction of the packet is equal to $h_1+h_3+h_4$ divided by $h_1+h_2'+h_3+h_4$ and is supplied to the first charge storage cell 15 of the first stage of the first shift register 60. The second fraction is equal to $h_2'$ divided by $h_1+h_2'+h_3+h_4$ and is supplied to the first charge storage cell 15 of the first stage of the second shift register 60' where it is stored. The charge in the first charge storage cell of the first stage of the first shift register is divided into a portion proportional to $h_1$, which is collected at the collecting means 19a, the portion of the charge packet stored in the second storage region 17 of the first cell is $h_2+h_3$. Over the next clocking cycle this portion of the packet of charge is transferred into the first charge storage cell of the second stage where it remains intact as $\alpha_2$ is equal to zero. Also, over the second clocking cycle the charge packet proportional to $h_2'$ stored in the first cell 15 of the first stage of the second shift register 60' is transferred to the first cell 15 of the second stage of this shift register where it is collected on the collecting means 19b'. Over the third clocking cycle the packet of charge in the second stage of the first shift register 60 is transferred to the first storage cell of the third stage of the first shift register 60 where a portion proportional to $h_3$ is divided out in the first storage cell or region thereof and collected on collecting means 19c. The portion $h_4$ is stored in the second storage region of the first storage cell 15 of the third stage. Over the fourth clock cylce charge is transferred from the second storage region of the first storage cell of the third stage to the first charge storage cell of the fourth stage of the first shift register where it is collected on the collecting means 19d. As the collection means 19a, 19c and 19d are connected together, these collection means connected in common provide charge proportional to the sum of the charges collected on the collecting means at the end of each of the consecutive clocking cycles of the first shift register. These outputs are sensed across the load resistor $R_1$ and are applied to the non-inverting terminal 65 of the differential amplifier 66. Similarly, the collection means 19b' of the second shift register provides an output at the end of the second clocking cycle which is proportional to the charge applied to this shift register producing an output voltage across resistor $R_2$ which is applied to the inverting terminal 67 of the differential amplifier 66. Thus, an output is obtained at the output of differential amplifier 66 which is the difference of the signals appearing the inputs thereof.

When a sequence of charge packets are applied, each corresponding to a respective sample of a signal, to the input section 61 of the transversal filter, packets are divided and clocked simultaneously from stage-to-stage in sequence and fractions thereof are collected on the various collecting means of the first shift register and the second shift register. The charge collected on the combined collection means 19a, 19c and 19d of the first shift register is the sum of the contributions of the various packets of the sequence and accordingly the voltage developed across the resistance $R_1$ and at terminal 20 would correspond thereto. Similarly, the charge collected on the collection means 19b' represents the contribution of the negative component of the packet and the voltage developed across the resistance at output terminal 20' would correspond thereto. It will be recognized that the packet of charge applied to the input section represents a definite packet of charge but may represent a negative signal sample of the input signal, if it is smaller than the magnitude of a bias packet. The total quantity of positive weighted charge collected at the common collecting means 19a, 19c and 19d would be less when there is a negative component than if there were not a negative component. Accordingly, a proper value of negative weighted charge is developed across the common collection means. Similarly, a proper value of negative weighted charge is collected on the common collecting means 19b' of the second shift register. Thus, in either case, at the common collection means of the first shift register positive weighted charge is provided and similarly at the output of the second shift register on the common collection means a value of negative weighted charge is provided. Thus, over successive cycles of operation successive pairs of positive and negative weighted charges are provided at the output collection means of the first and second shift registers. To obtain each of the values of the sequence of output values from the positive component sequence obtained at the output of the first shift register and the negative component sequence obtained at the output of the second shift register, the difference of corresponding values of the positive component sequence and the negative component sequence must be obtained and is obtained by the differential amplifier. The values of the sequence of output values are unique.

From the description above it will be readily recognized that the width of the first channel of the first shift register could be widened by a fixed amount and also the width of the first channel of the second shift register could be widened by the same fixed amount. In such a case for a given series of sample data inputs a different series of positive component sequence outputs and negative component sequence outputs would be obtained. However, the outputs obtained by taking the difference of corresponding elements of the positive component sequence inputs and the negative component sequence inputs would be identical to the previous case.

Also, a given weighting in a stage of the transversal filter could be obtained by providing weightings in corresponding stages of the two shift registers of the transversal filter with the difference of the two corresponding to the net desired weighting.

Thus, the output of the first shift register is in the form of a first sequence of real packets of charge representing the positive components of an output signal, and the output of the second shift register is also in the form of a second sequence of real packets of charge (not deficits of charge) representing the negative components of the output signal. The unique values of the output sequences of charge is obtained by taking the difference of corresponding values of the first and second sequences.

It is often desirable to utilize not just a single filter section but a plurality of filter sections and cascade them to provide a composite response. The filter sections can have the same characteristics or have different characteristics in the time domain and the resultant impulse response would be obtained by the convolution of the impulse responses of the individual filter sections. In the frequency domain the resultant characteristic would be obtained by multiplying the frequency characteristics of the individual filter sections. The filter of FIG. 6 is responsive to a voltage input and provides a voltage output. Thus, to cascade filter sections of the form shown in FIG. 6 it would simply be necessary to take the output of one filter section and apply it to the input of the next filter section. Such a system requires the conversion of charge into voltage at the output of one filter section and the reconversion of the voltage signal to a charge signal at the input of the next succeeding filter section. Such a system not only requires additional apparatus, but also requires appreciable settling time in the operation of the system and thereby reduces the maximum operating frequency of the system.

Figure 7:
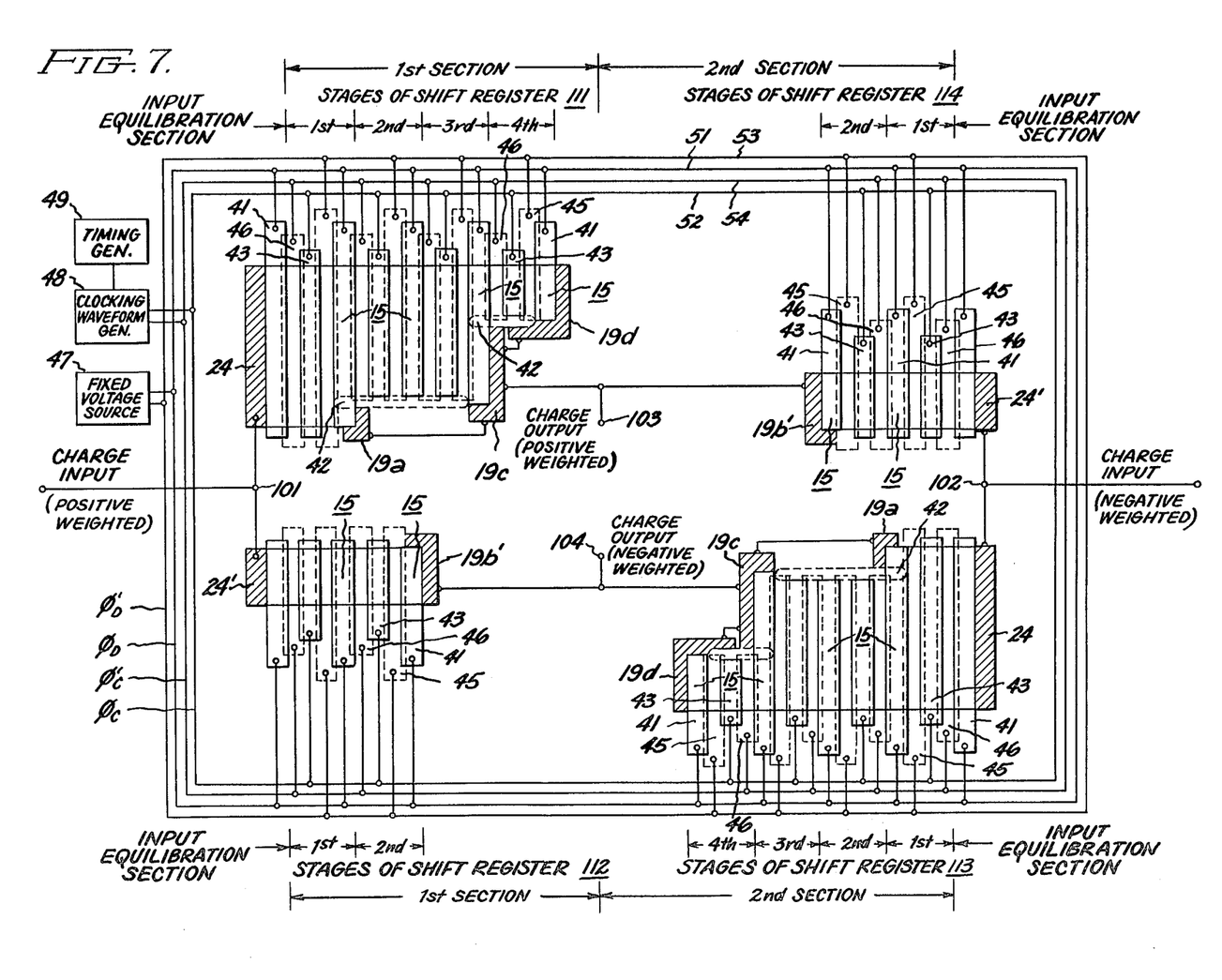
FIG. 7 is a plan view of a further embodiment of the present invention.

The present invention in another aspect thereof is directed to the provision of a transversal filter in which the input and the output thereof have uniform charge representation and in particular has a pair of input channels and a pair of output channels in which an input signal is applied in the form of a positive component sequence, the values of which are represented by positive quantities of charge and a negative component sequence, also represented by positive quantities of charge. The difference in corresponding quantities of charge in the two series representing the value of the corresponding value in the input signal sequence. Similarly, at the output of such a transversal filter a first series of packets of charge corresponding to the positive component values of the resultant output signal is obtained in one channel and a second series of packets of charge corresponding to negative component values of the resultant output signal is obtained in another channel. The resultant output signal is represented by the difference in corresponding quantities of charge in the first and second series of packets. Such a filter requires a positive weighted input channel and a negative weighted input channel in which positive quantities of charge are utilized and also a pair of output channels in which positive quantities of charge are utilized. The apparatus of FIG. 7 is directed to such a filter. The filter includes four stages, each stage having the same weighting coefficients as the four stages of the filter of FIG. 6. The filter of FIG. 7 would have the same frequency response characteristics as the filter of FIG. 6. The cascading of these two filters would provide an overall frequency response which is obtained by simply multiplying the frequency characteristic of one of the filters by itself. Before describing FIG. 7 further, the operations necessary for providing such a result will be analyzed.

Any sampled data transversal filter may be represented by a series of weighting coefficients $H_j$, each corresponding to a stage of the filter. The input signal may be represented by a series of samples $X_m$ and the output signal may be represented by a series of samples $Y_n$. If we label the first input signal sample as $X_1$ and the first valid output signal sample as $Y_n$, the response of the transversal filter may then be expressed by the following equation:

$$-Y_n = \begin{cases} \sum_{j=0}^{N-1} H_j X_{n-j} \text{ for } n \geq N, \\ \text{undefined for } n < N-1 \end{cases}$$

where N is the number of stages of the transversal filter, and $x_{n-j}$ is the input signal sample that occurred j sample periods prior to the output of $Y_n$. Equation 6 simply represents the convolution of the impulse response $H_j$ of the transversal filter with a series $X_m$ of input signal samples. It should be observed that $X_m$ may be either positive or negative, $H_j$ may be either positive or negative and also the samples of the sequence $Y_n$ may be either positive or negative. The $m^{th}$ element of the series $X_m$ is defined as follows:

$$X_m = X_m^+ - X_m^-, \tag{7}$$

where the values $X_m^+$ and $X_m^-$ are both greater than zero. For $X_m$ greater than zero, $X_m^+$ is greater than $X_m^-$, and for $X_m$ less than zero, $X_m^-$ is greater than $X_m^+$. Similarly, the $j^{th}$ weighting coefficient of the series $H_j$ is defined as follows:

$$H_j = H_j^+ - H_j^- \tag{8}$$

where $H_j^+$ and $H_j^-$ are both greater than zero. For $H_j$ greater than zero, $H_j^+$ is greater than $H_j^-$. For $H_j$ less than zero, $H_j^-$ is greater than $H_j^+$. Thus, by substituting in equation 6 the values for $X_m$ and the values for $H_j$ given by equations 7 and 8 the following equation is obtained:

$$Y_n = \sum_{j=0}^{N-1} (H_j^+ - H_j^-)(X_{n-j}^+ - X_{n-j}^-)$$

By performing the multiplication indicated in Equation 9, and collecting and rearranging the terms thereof the following equation is obtained:

$$Y_n = \sum_{j=0}^{N-1} (H_j^+ X_{n-j}^+ + H_j^- X_{n-j}^-) - \sum_{j=0}^{N-1} (H_j^+ X_{n-j}^- + H_j^- X_{n-j}^+)$$

Thus, from an inspection of equation 10, it is apparent that the output series of values $Y_n$ is the difference of a first series of positive component values given by the expression $$Y_n^+ = \sum_{j=0}^{N-1} (H_j^+ X_{n-j}^+ + H_j^- X_{n-j}^-)$$

and a second series of negative component values given by the expression:

$$Y_n^- = \sum_{j=0}^{N-1} (\overline{H}_j^- X_{n-j}^+ + H_j^+ \overline{X}_{n-j}^+)$$

The nth element of the series $Y_n$ may be represented by the following equation:

$$Y_n = Y_n^+ - Y_n^-, \quad (13)$$

where $Y_n^+$ and $Y_n^-$ are both greater than zero. For $Y_n^+$ greater than $Y_n^-$, $Y_n^+$ is greater than zero. For $Y_n$ less than zero, $Y_n^-$ is greater than $Y_n^+$. Thus, the output $Y_n$ is of the same form as the input series $X_m$, and accordingly apparatus which functions in the mode depicted by these equations would have uniform input and output representation.

Reference is now made to FIG. 7 which shows a sample data filter 100 having four stages in which both positive and negative weighting coefficients are utilized in the various stages thereof and in which the input signal is in the form of a first sequence of charge packets representing positive weighted components of the signal and a second sequence of packets of charge representing the negative weighted components of the signal. The filter includes a pair or input terminals 101 and 102, and a pair of output terminals 103 and 104. To terminal 101 the first sequence of packets of charge is applied, each packet of the sequence corresponding to the positive component of a respective element of the input signal sequence. To input terminal 102 the second sequence of packets of charge is applied, each packet of the sequence corresponding to the negative component of a respective element of the input signal sequence. Each element of the input signal sequence is the difference in the respective elements of the first and second sequences. At the output terminal 103, a first sequence of packets of charge is obtained, each packet representing a respective positive component of a respective element of the output signal sequence. At the output terminal 104, a second sequence of packets of charge is obtained, each packet representing a respective negative component of a respective element of the output signal sequence. Each element of the output signal sequence is obtained by subtracting the negative component from the positive component of corresponding elements of the first and second output sequences. The filter 100 also comprises a first section including a first shift register 111 in which positive weighting coefficients are provided and a second shift register 112 in which negative weighting coefficients are provided, and also comprises a second section in which is included a first shift register 113 in which positive weighting coefficients are provided and a second shift register 114 in which negative weighting coefficients are provided.

For convenience in describing and explaining the invention the filter of FIG. 7 is provided with the same impulse response as the filter of FIG. 6. As this is the case, shift register 111 and shift register 113 are identical to shift register 60 of FIG. 6 and corresponding elements thereof are identically designated. Accordingly, the weighting coefficient of the first, third and fourth stages of the shift registers 111 and 113 are respectively $h_1$, $h_3$ and $h_4$. Shift registers 112 and 114 are identical to the second shift register 60' of FIG. 6 and corresponding elements thereof are identically designated. The weighting coefficient of the second stage of shift registers 112 and 114 is $h_2'$. The region of opposite conductivity type 24 of the composite input cell of the first shift register 111 and the region of opposite conductivity type 24' of the composite input cell of the second shift register 112 are conductively connected together and to the input terminal 101. Similarly the region of opposite conductivity type 24 of the composite input cell of the first shift register 113 and the region of opposite conductivity type 24' of the composite cell of the second shift register 114 are conductively connected together and to the input terminal 102. The common collection means 19a, 19c and 19d of the first shift register 111 is connected to the output terminal 103. The common collection means 19b' of the second shift register 112 is connected to the output terminal 104. The common collection means 19a, 19b, and 19c of the first shift register 113 is connected to the output terminal 104. The common connection means 19b' of the second shift register 114 is connected to the output terminal 103. The sequence of positive components of signal applied to the input terminal 101 are convolved with the positive weighting coefficients of the first shift register 111 and produce components of charge which are positive weighted and accordingly are supplied to the positive weighted output terminal 103. The sequence of positive components of signal applied to the input terminal 101 are also convolved with the negative weighting coefficients of the second shift register 112 and produce components of charge which are negative weighted and accordingly are supplied to the negative weighted output terminal 104. The sequence of negative components of signal applied to the input terminal 102 are convolved with the positive weighting coefficients of the first shift register 113 and produce components of charge which are negative weighted and accordingly are supplied to the negative weighted output terminal 104. The sequence of negative components of signal applied to the input terminal 102 are also convolved with the negative weighting coefficients of the second shift register 114 and produce components of charge which are positive weighted and accordingly are supplied to the positive weighted output terminal 103.

In the operation of the apparatus of FIG. 7 a first sequence of packets of charge each packet corresponding to a respective positive component of a signal is supplied to the input terminal 101, and a second sequence of packets of charge each packet corresponding to a respective negative component of the signal is supplied to the input terminal 102. Each of the first sequence of packets supplied to terminal 101 are split into two fractions. A first fraction of each packet equal to $h_1 + h_3 + h_4$ divided by $h_1 + h_2' + h_3 + h_4$ is supplied to the first shift register 111 of the first section and a second fraction of each packet equal to $h_2'$ divided by $h_1 + h_2' + h_3 + h_4$ is supplied to the second shift register of the first section. Similarly, a first fraction of each of the second sequence of packets equal to $h_1 + h_3 + h_4$ divided by $h_1 + h_2' + h_3 + h_4$ is supplied to the first shift register 113 of the second section, and also a second fraction of each packet of the second sequence equal to $h_2'$ divided by $h_1 + h_2' + h_3 + h_4$ is supplied to the second shift register 114 of the second section. Each packet of each of the series is clocked from stage to stage in each of the two sections of the filter. The output obtained at the common collection means of the first shift register 111 of the first section represents the convolution set forth in the first term of Equation 11. The output obtained at the collection means 19b' of the second shift register 114 of the second section corresponds to the second convolution term of Equation 11. Both of these convolutions represent positive components of the output signal and are consequently collected at the positive terminal 103 of the filter. The output obtained at the collection means 19b' of the second shift register of the first section corresponds to the convolution represented by the first term of Equation 12. The output obtained at the common collection means 19a, 19c and 19d of the first shift register of the second section corresponds to the convolution represented by the second term of Equation 12. Both of these latter convolutions represent the negative components of the second sequence and accordingly are collected at output terminal 104. To obtain the output signal sequence the negative weighted output at terminal 104 is substrated from the positive weighted output at terminal 103 by means of a differential sensing and output circuit, as described in connection with the apparatus of FIG. 6. To cascade the filter with another similarly constituted filter the positive weighted output terminal 103 would be connected to the positive weighted input terminal of the succeeding filter and also the negative weighted output terminal 104 would be connected to the negative weighted input terminal of the succeeding filter.

While a four stage filter having three positive weighting coefficients and a single negative weighting coefficient has been described in connection with the filters of FIGS. 6 and 7, it is understood that other combinations of positive and negative weighting coefficients may be provided. The number of stages utilized could also be of much larger number than the four shown in the filters of FIGS. 6 and 7.

While the filters of FIGS. 2, 6, and 7 have utilized charge transfer devices in which charge storage and transfer occurs in cells adjacent the surface of the semiconductor substrate, the present invention may be implemented with cells of opposite conductivity type regions. Structures of this type, commonly referred to as buried channel charge transfer devices, described in U.S. Pat. No. 3,902,187, assigned to the assignee of the present invention and incorporated herein by reference thereto. In such buried channel charge transfer devices charge storage and transfer occurs in cells below the surface of the semiconductor substrate. Implementation of prior art charge transfer filters with buried channel devices has particular advantages with respect to high speed operation, but suffers from nonlinearities resulting from the variable capacitance between the charge storage cells and their associated overlying electrodes. In the present invention such nonlinearities are not introduced into the output. In connection with a buried channel implementation, of course, surface charges input circuits such as those described above could be used.

The filter apparatus of the present invention may also be implemented in bucket brigade technology; however, such implementation would be less advantageous than in the charge coupled technology shown and described in FIGS. 2, 6, and 7, as bucket bricade devices are subject to charge transfer inaccuracies which limit their performance.

While charge division has been described where a single packet of charge is divided into two or more packets during the charge transfer operation, other means of dividing charge may be utilized in the apparatus of the present invention Such charge division means are described in U.S. Pat. No. 4,124,861 and 4,124,862, both assigned to the assignee of the present invention and incorporated herein by reference thereto.

While the invention has been described in specific embodiments in which single phase clocking systems have been employed, it will be understood that other clocking systems, such as multi-phase clocking systems, may as well be employed.

While the invention has been described in connection with apparatus constituted of N-type conductivity substrates, P-type conductivity substrates could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What we claim as new and desire to secure by Letters Patent of the United States is:

1. Charge transfer apparatus comprising
   a plurality of first charge storage cells arranged in a sequence, each of said first charge storage cells divided into parts,
   charge division means for dividing charge among said parts of said first charge storage cells,
   the ratio of the charge contained within a first part of each of said first charge storage cells to the sum of the charges contained within all of the parts thereof being set equal to a respective one of a first sequential series of first predetermined values,
   said first sequential series of first predetermined values being set to provide a series of weighting coefficients, each for a respective first charge storage cell,
   said plurality of first charge storage cells being serially coupled to form a first plurality of stages of a charge transfer shift register, each stage including a respective first charge storage cell,
   a plurality of collection means, each collection means coupled to a first part of a respective first charge storage cell for collecting charge stored therein, said plurality of collection means being connected in common,
   means for providing a first input sequence of packets of charge, each packet representing a respective sample of a signal,
   means for introducing sequentially into the initial cell of said shift register each of said first packets of charge and thereafter periodically and serially transferring and dividing each of said packets of charge from first charge storage cell to first charge storage cell including the transfer of portions of said packets of charge from each of said first parts to a respective collection means, the sequence of charges collected by said plurality of collection means connected in common providing an output sequence of packets,
   said output sequence of packets representing the convolution of said first input sequence of packets with said series of weighting coefficients.

2. Charge transfer apparatus comprising
   a plurality of first charge storage cells arranged in a sequence,
   means for dividing each of said first charge storage cells into a plurality of parts such that the ratio of charge stored within a first part thereof to the sum of the charges stored within all of the parts thereof is equal to a respective one of a sequential series of predetermined values,
   said sequential series of predetermined values corresponding to a sequential series of weighting coefficients, each for a respective first charge storage cell, said plurality of first charge storage cells being serially coupled to form a plurality of stages of a charge transfer shift register, each stage including a respective first charge storage cell, a plurality of collection means, each collection means coupled to a first part of a respective first charge storage cell for collecting charge stored therein, selected ones of said plurality of collection means being connected in common, means for providing a first input sequence of packets of charge, each packet representing a respective sample of a signal, means for introducing sequentially into the initial cell of said shift register each of said packets of charge of said first series and thereafter periodically and serially transferring and dividing each of said packets of charge from first charge storage cell to first charge storage cell including the transfer of portions of said packets of charge from each of said first parts to a respective collection means, whereby a first output sequence of packets of charge is collected by said collection means connected in common, said output sequence of packets representing the convolution of said first input sequence of packets with said series of weighting coefficients.

3. The apparatus of claim 2 in which said plurality of first charge storage cells are formed in a substrate of semiconductor material.

4. The apparatus of claim 3 in which said plurality of first charge storage cells are formed adjacent a major surface of said substrate of semiconductor material.

5. The apparatus of claim 2 in which each of said first charge storage cells has a maximum of two parts.

6. The apparatus of claim 2 in which said series of said weighting coefficients constitutes a system function.

7. The apparatus of claim 2 in which all of said collection means except the last are connected in common.

8. The apparatus of claim 2 in which all of said collection means are connected in common.

9. Charge transfer apparatus comprising a first plurality of first charge storage cells arranged in a sequence, means dividing each of said first charge storage cells into parts in a manner so that the ratio of charge contained within a first part of each of said first charge storage cells to the sum of the charges contained within all of the parts thereof is equal to a respective one of a first sequential series of predetermined values, said first sequential series of predetermined values corresponding to a sequential series of positive weighting coefficients, each for a respective first charge storage cell, said first plurality of first charge storage cells being serially coupled to form a plurality of stages of a first charge transfer shift register, each stage including a respective first charge storage cell, a first plurality of collection means, each collection means coupled to a first part of a respective first charge storage cell for collecting charge stored therein, selected ones of said first plurality of collection means being connected in common, a second plurality of first charge storage cells arranged in a sequence, means dividing each of said first charge storage cells into parts in a manner so that the ratio of charge contained within a first part of each of said first charge storage cells to the sum of the charges contained within all of the parts thereof is equal to a respective one of a second sequential series of predetermined values, said second sequential series of predetermined values corresponding to a sequential series of negative weighting coefficients, each for a respective first charge storage cell, said second plurality of first charge storage cells being serially coupled to form a plurality of stages of a second charge transfer shift register, each stage including a respective first charge storage cell, a second plurality of collection means, each collection means coupled to a first part of a respective first charge storage cell for collecting charge stored therein, selected ones of said second plurality of collection means being connected in common, means for providing a first input sequence of packets of charge, each packet representing a respective sample of a signal, means for dividing each packet into a first portion and a second portion, said first portion being a first fixed fraction of the packet, said fixed fraction being equal to the sum of the positive weighting coefficients divided by the sum of the positive and negative weighting coefficients, said second portion being a second fixed fraction of the packet, said second fixed fraction being equal to one minus said first fixed fraction, means for introducing sequentially into the initial cell of said first shift register each of the first portions of said packets of charge and thereafter periodically and serially transferring and dividing each of said first portions of said packets of charge from first charge storage cell to first charge storage cell including the transfer of portions of said first portions of said packets of charge from each of said first parts to a respective collection means, means for introducing sequentially into the initial cell of said second shift register each of the second portions of said packets of charge and thereafter periodically and serially transferring and dividing each of said second portions of said packets of charge from first charge storage cell to first charge storage cell including the transfer of portions of said second portions of said packets of charge from each of said first parts to a respective collection means, whereby a first output sequence of charges is collected by selected ones of said first plurality of collection means connected in common, said first output sequence of packets representing the convolution of said first portions of said packets of charge with said series of positive weighting coefficients, and also a second output sequence of charges is collected by selected ones of said second plurality of collection means connected in common, said output sequence of packets representing the convolution of said second portions of said packets of charge with said series of negative weighting coefficients.

10. The apparatus of claim 9 in which is provided a third plurality of first charge storage cells arranged in a sequence, means dividing each of said first charge storage cells into parts in a manner so that the ratio of charge contained within a first part of each of said first charge storage cells to the sum of the charges contained within all of the parts thereof is equal to a respective one of a third sequential series of predetermined values, said third sequential series of predetermined values corresponding to a sequential series of negative weighting coefficients, each for a respective first charge storage cell, said third series being identical to said second series of predetermined values, said third plurality of first charge storage cells being serially coupled to form a plurality of stages of a third charge transfer shift register, each stage including a respective first charge storage cell, a third plurality of collection means, each collection means coupled to a first part of a respective first charge storage cell of said third plurality for collecting charge stored therein, selected ones of said third plurality of collection means being connected in common, to a third terminal, a fourth plurality of first charge storage cells arranged in a sequence, means dividing each of said first charge storage cells into parts in a manner so that the ratio of charge contained within a first part of each of said first charge storage cells to the sum of the charges contained within all of the parts thereof is equal to a respective one of a fourth sequential series of predetermined values, said fourth sequential series of predetermined values corresponding to a second sequential series of positive weighting coefficients, each for a respective first charge storage cell, said fourth series being identical to said first series, said fourth plurality of first charge storage cells being serially coupled to form a plurality of stages of a fourth charge transfer shift register, each stage including a respective first charge storage cell, a fourth plurality of collection means, each collection means coupled to a first part of a respective first charge storage cell of said fourth plurality for collecting charge stored therein, selected ones of said fourth plurality of collection means being connected in common to a fourth terminal, said first and third terminals connected together to provide a first output terminal, said second and fourth terminals connected together to provide a second output terminal, means for providing a first input sequence of packets of charge, each packet representing the positive weighted components of a signal, means for dividing each packet of said first input sequence into a first portion and a second portion, said first portion being a first fixed fraction of the packet, said fixed fraction being equal to the sum of the positive weighting coefficients divided by the sum of the positive and negative weighting coefficients, said second portion being a second fixed fraction of the packet, said second fixed fraction being equal to one minus said first fixed fraction, means for introducing sequentially into the initial cell of said first shift register each of the first portions of said packets of charge of said first input sequence and thereafter periodically and serially transferring and dividing each of the first portions of said packets of charge from first charge storage cell to first charge storage cell including the transfer of portions of said first portions of said packets of charge from each of said first parts to a respective collection means, means for introducing sequentially into the initial cell of said second shift register each of the second portions of said packets of charge of said first input sequence and thereafter periodically and serially transferring and dividing each of the second portions of said packets of charge from first charge storage cell to first charge storage cell including the transfer of portions of said second portions of said packets of charge from each of said first parts to a respective collection means, means for providing a second input sequence of packets of charge, each packet representing the negative weighted components of a signal, means for dividing each packet of said second input sequence into a first portion and a second portion, said first portion being a first fixed fraction of the packet, said fixed fraction being equal to the sum of the positive weighting coefficients divided by the sum of the positive and negative weighting coefficients, said second portion being a second fixed fraction of the packet, said second fixed fraction being equal to one minus said first fixed fraction, means for introducing sequentially into the initial cell of said third shift register each of the second portions of said packets of charge of said second input sequence and thereafter periodically and serially transferring and dividing each of the second portions of said packets of charge from first charge storage cell to first charge storage cell including the transfer of portions of the second portions of said packets of charge from each of said first parts to a respective collection means, means for introducing sequentially into the initial cell of said fourth shift register each of the first portions of said packets of charge of said second input sequence and thereafter periodically and serially transferring and dividing each of the first portions of said packets of charge from first charge storage cell to first charge storage cell including the transfer of portions of the first portions of said packets of charge from each of said first parts to a respective collection means, whereby a first output sequence of positive weighted components is collected at said first output terminal and a second output sequence of negative weighted components is collected at said second output terminal.

* * * * *